(12) United States Patent
Zhong et al.

(10) Patent No.: US 11,480,639 B1
(45) Date of Patent: Oct. 25, 2022

(54) METHOD AND APPARATUS FOR IMPROVED EFFICIENCY OF NON-CARTESIAN IMAGING USING ACCELERATED CALIBRATION SCAN FOR K-SPACE SHIFT CORRECTION

(71) Applicant: Siemens Healthcare GmbH, Erlangen (DE)

(72) Inventors: Xiaodong Zhong, Oak Park, CA (US); Vibhas S. Deshpande, Austin, TX (US); Marcel Dominik Nickel, Herzogenaurach (DE); Fei Han, Beverly Hills, CA (US)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/321,588

(22) Filed: May 17, 2021

(51) Int. Cl.
 *G01R 33/48* (2006.01)
 *G01R 33/58* (2006.01)
(52) U.S. Cl.
 CPC ......... *G01R 33/4824* (2013.01); *G01R 33/58* (2013.01)
(58) Field of Classification Search
 CPC ............................ G01R 33/4824; G01R 33/58
 See application file for complete search history.

(56) References Cited

U.S. PATENT DOCUMENTS

| | | | |
|---|---|---|---|
| 2018/0143277 A1* | 5/2018 | Chen | G01R 33/5611 |
| 2019/0195975 A1* | 6/2019 | Liu | G01R 33/583 |
| 2022/0057468 A1* | 2/2022 | Polak | G01R 33/4824 |

OTHER PUBLICATIONS

Block KT, Chandarana H, Milla S, et al. Towards Routine Clinical Use of Radial Stack-of-Stars 3D Gradient-Echo Sequences for Reducing Motion Sensitivity. J Korean Soc Magn Reson Med. 2014;18(2):87. doi:10.13104/iksmrm.2014.18.2.87.

Fujinaga Y, Kitou Y, Ohya A, et al. Advantages of radial volumetric breath-hold examination (VIBE) with k-space weighted image contrast reconstruction (KWIC) over Cartesian VIBE in liver imaging of volunteers simulating inadequate or no breath-holding ability. Eur Radiol. 2016;26(8):2790-2797. doi:10.1007/s00330-015-4103-7.

Armstrong T, Dregely I, Stemmer A, et al. Free-breathing liver fat quantification using a multiecho 3D stack-of-radial technique: Free-Breathing Radial Liver Fat Quantification. Magn Reson Med. 2018;79(1):370-382. doi:10.1002/mrm.26693.

(Continued)

*Primary Examiner* — G. M. A Hyder

(57) ABSTRACT

A system and method for performing accelerated k-space shift correction calibration scans for non-Cartesian trajectories is provided. The method can include applying an MRI sequence, performing a calibration scan based on the MRI sequence using the non-Cartesian trajectory to acquire k-space shift data, wherein one or more partitions are skipped during the calibration scan, interpolating the skipped one or more partitions using the k-space shift data from adjacent partitions, and calibrating the MRI system using the k-space shift data and the interpolated k-space shift data. In some embodiments, an acceleration factor Acc can be defined and the calibration scan acquires k-space shift data for only one partition in every Acc partitions.

24 Claims, 11 Drawing Sheets

(56) References Cited

OTHER PUBLICATIONS

Zhong X, Hu HH, Armstrong T, et al. Free-Breathing Volumetric Liver R2* and Proton Density Fat Fraction Quantification in Pediatric Patients Using Stack-of-Radial MRI With Self-Gating Motion Compensation. J Magn Reson Imaging. Published online Jun. 2020:jmri.27205. doi:10.1002/jmri.27205.

Chandarana, Hersh, et al. "Free-breathing radial 3D fat-suppressed T1-weighted gradient echo sequence: a viable alternative for contrast-enhanced liver imaging in patients unable to suspend respiration." Investigative radiology 46.10 (2011): 648-653.

Chandarana H, Feng L, Block TK, et al. Free-Breathing Contrast-Enhanced Multiphase MRI of the Liver Using a Combination of Compressed Sensing, Parallel Imaging, and Golden-Angle Radial Sampling: Investigative Radiology. 2013;48(1):10-16. doi:10.1097/RLI.0b013e318271869c.

Armstrong, Tess, et al. "Free-breathing quantification of hepatic fat in healthy children and children with nonalcoholic fatty liver disease using a multi-echo 3-D stack-of-radial MRI technique." Pediatric radiology 48.7 (2018): 941-953.

Reeder, Scott B., et al. "Referenceless interleaved echo-planar imaging." Magnetic Resonance in Medicine: An Official Journal of the International Society for Magnetic Resonance in Medicine 41.1 (1999): 87-94.

Peters, Dana C., J. Andrew Derbyshire, and Elliot R. McVeigh. "Centering the projection reconstruction trajectory: reducing gradient delay errors." Magnetic Resonance in Medicine: An Official Journal of the International Society for Magnetic Resonance in Medicine 50.1 (2003): 1-6.

Grimm, Robert, et al. "Optimal channel selection for respiratory self-gating signals." Proc. 21st Annual Meeting ISMRM, Salt Lake City, Utah, USA. 2013.

Zhong, Xiaodong, et al. "Liver fat quantification using a multi-step adaptive fitting approach with multi-echo GRE imaging." Magnetic resonance in medicine 72.5 (2014): 1353-1365.

Grimm R, Block KT, Hutter J, Forman C, Hintze C, Kiefer B, Hornegger J. Self-gating reconstructions of motion and perfusion for free-breathing T1-weighted DCE-MRI of the thorax using 3D stack-of-stars GRE imaging. Proc. Intl. Soc. Mag. Reson. Med. 20, 2012. p. 598.

Zhong X, Armstrong T, Nickel MD, et al. Effect of respiratory motion on free-breathing 3D stack-of-radial liver R2* relaxometry and improved quantification accuracy using self-gating. Magn Reson Med 2020;83:1964-1978.

Gao C, Hu P, Dale B, Nickel MD, Kannengiesser SAR, Kiefer B, Deshpande V, Zhong X. A stability study of breath-hold and free-breathing liver fat and R2* quantification at 1.5T and 3T. Proc. Intl. Soc. Mag. Reson. Med. 28, 2020. p. 3165.

Zhong, X., 2021. Accelerated k-Space Shift Calibration for Free-Breathing Stack-of-Radial MRI Quantification of Liver Fat and R2*, ISMRM (May 15-20, 2021).

* cited by examiner

METHOD AND APPARATUS FOR IMPROVED EFFICIENCY OF NON-CARTESIAN IMAGING USING ACCELERATED CALIBRATION SCAN FOR K-SPACE SHIFT CORRECTION

CROSS-REFERENCE TO RELATED APPLICATIONS

The present application claims priority to U.S. Provisional Patent Application No. 63/137,773, titled METHOD AND APPARATUS FOR IMPROVED EFFICIENCY OF NON-CARTESIAN IMAGING USING ACCELERATED CALIBRATION SCAN FOR K-SPACE SHIFT CORRECTION, filed Jan. 15, 2021, which is hereby incorporated by reference herein in its entirety.

BACKGROUND

Non-Cartesian magnetic resonance imaging (MRI) has several benefits over Cartesian MRI. For instance, non-Cartesian MRI techniques, such as radial MRI, have demonstrated substantial motion insensitivity for free-breathing applications. However, one drawback that the radial MRI technique has is the relatively long acquisition time compared to Cartesian MRI techniques. In addition, radial MRI often needs to perform calibration scans for k-space shift correction, which typically consumes 10-20 seconds of acquisition time, depending on the imaging parameters and other protocols being utilized. The calibration scan is necessary to obtain accurate results, especially for quantitative mapping applications using radial MRI such as proton density fat fraction (PDFF) and $R_2^*$ mapping. Therefore, there is a need in the technical field for systems and methods to decrease the acquisition time of the calibration scan when using non-Cartesian MRI trajectories.

SUMMARY

Described herein are systems and methods for performing accelerated k-space shift correction calibration scans, which are particularly well-suited for non-Cartesian trajectories.

In one embodiment, the present disclosure is directed to a computer-implemented method for acquiring magnetic resonance imaging (MRI) data using a non-Cartesian trajectory, the method comprising: applying, by a MRI system, an MRI sequence; performing, by the MRI system, a calibration scan based on the MRI sequence using the non-Cartesian trajectory to acquire k-space shift data, wherein one or more partitions are skipped during the calibration scan; interpolating, by the MRI system, the skipped one or more partitions using the k-space shift data from adjacent partitions; and calibrating the MRI system using the k-space shift data and the interpolated k-space shift data.

In another embodiment, the present disclosure is directed to a medical imaging system for acquiring magnetic resonance imaging (MRI) data using a non-Cartesian trajectory, the medical imaging system comprising: an MRI machine; and a computer system coupled to the MRI machine. The computer system comprises a processor and a memory coupled to the processor. The memory stores instructions that, when executed by the processor, cause the computer system to: control the MRI machine to apply an MRI sequence; control the MRI machine to perform a calibration scan based on the MRI sequence using the non-Cartesian trajectory to acquire k-space shift data, wherein one or more partitions are skipped during the calibration scan; interpolate the skipped one or more partitions using the k-space shift data from adjacent partitions; and calibrate the MRI machine using the k-space shift data and the interpolated k-space shift data.

FIGURES

The accompanying drawings, which are incorporated in and form a part of the specification, illustrate the embodiments of the invention and together with the written description serve to explain the principles, characteristics, and features of the invention. In the drawings.

DESCRIPTION

This disclosure is not limited to the particular systems, devices and methods described, as these may vary. The terminology used in the description is for the purpose of describing the particular versions or embodiments only, and is not intended to limit the scope.

As used herein, the terms "algorithm," "system," "module," or "engine," if used herein, are not intended to be limiting of any particular implementation for accomplishing and/or performing the actions, steps, processes, etc., attributable to and/or performed thereby. An algorithm, system, module, and/or engine may be, but is not limited to, software, hardware and/or firmware or any combination thereof that performs the specified functions including, but not limited to, any use of a general and/or specialized processor in combination with appropriate software loaded or stored in a machine readable memory and executed by the processor. Further, any name associated with a particular algorithm, system, module, and/or engine is, unless otherwise specified, for purposes of convenience of reference and not intended to be limiting to a specific implementation. Additionally, any functionality attributed to an algorithm, system, module, and/or engine may be equally performed by multiple algorithms, systems, modules, and/or engines, incorporated into and/or combined with the functionality of another algorithm, system, module, and/or engine of the same or different type, or distributed across one or more algorithms, systems, modules, and/or engines of various configurations.

As used herein, the terms "MRI sequence," "pulse sequence," or "MRI pulse sequence" are interchangeable and can include a particular combination of pulse sequences and/or pulsed field gradients that result in a particular set of MRI data. An MRI sequence can be used either individually or in combination with one or more other MRI sequences (i.e., multi-parametric MRI).

As used herein, the term "MRI data" can include an MRI image or any other data obtained via MRI (e.g., biomarker data or a parameter map). An MRI image can include a three-dimensional image or a two-dimensional image (e.g., a slice of a three-dimensional image).

Improved Efficiency of Non-Cartesian Imaging Using Accelerated Calibration Scan for K-Space Shift Correction This disclosure is generally directed to computer-implemented methods and systems implementing non-Cartesian MRI trajectories, particularly systems and methods for improving the efficiency of non-Cartesian MRI trajectories. Non-Cartesian MRI trajectories can include a variety of different data acquisition trajectories, including radial, stack-of-stars, or spiral trajectories. Non-Cartesian MRI trajectories include any data acquisition trajectory used with MRI, except a Cartesian (i.e., row-by-row) trajectory. The systems and methods described herein can be used for obtaining images of a patient, generating parameter maps, and so on.

Figure 1A:
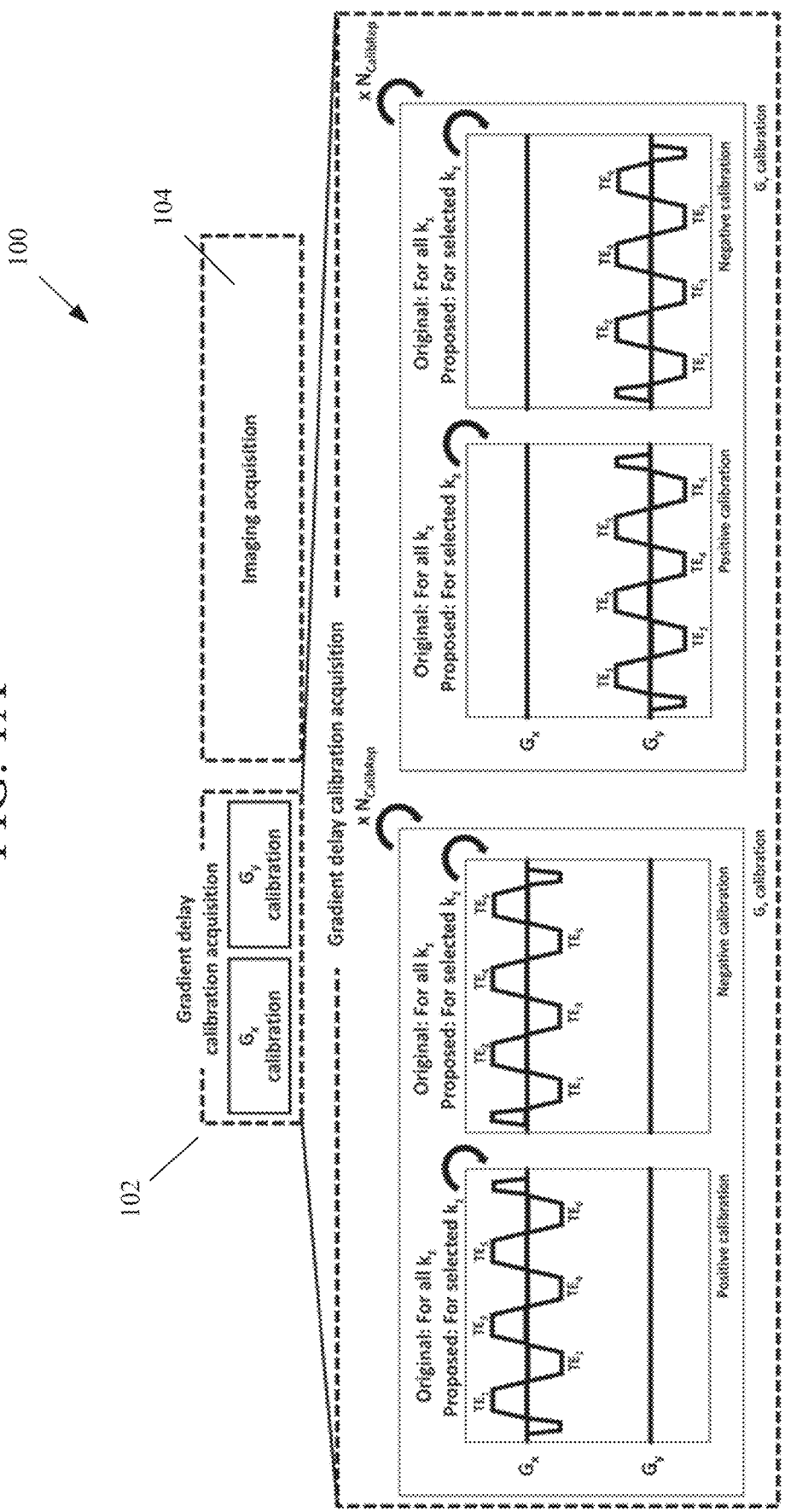
FIG. 1A is a diagram illustrating the k-space shift data calibration scan in a MR pulse sequence, in accordance with at least one aspect of the present disclosure.
Figure 1B:
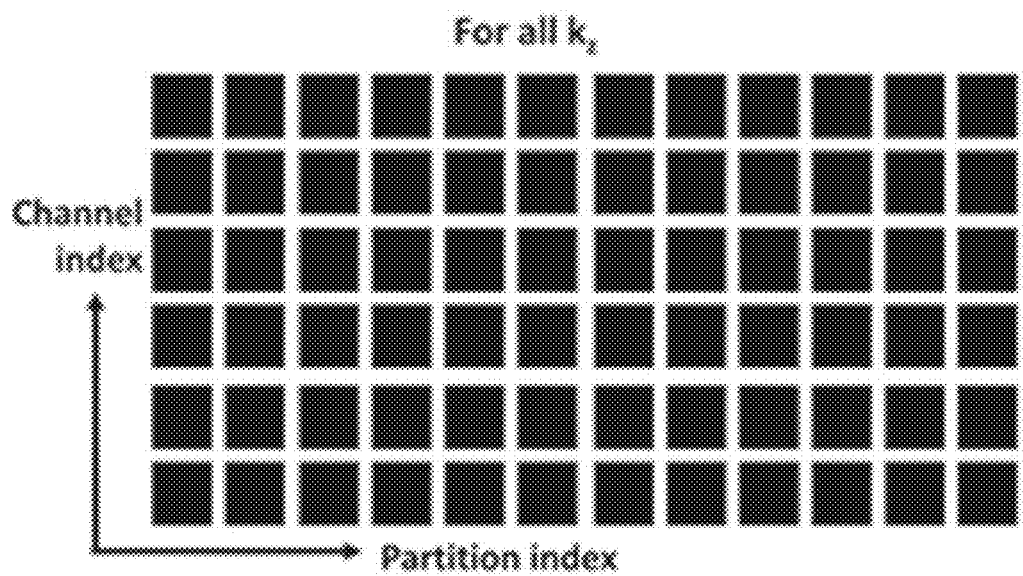
FIG. 1B is a diagram illustrating an unmodified k-space shift data acquisition with respect to the partition and channel indices, in accordance with at least one aspect of the present disclosure.
Figure 1C:
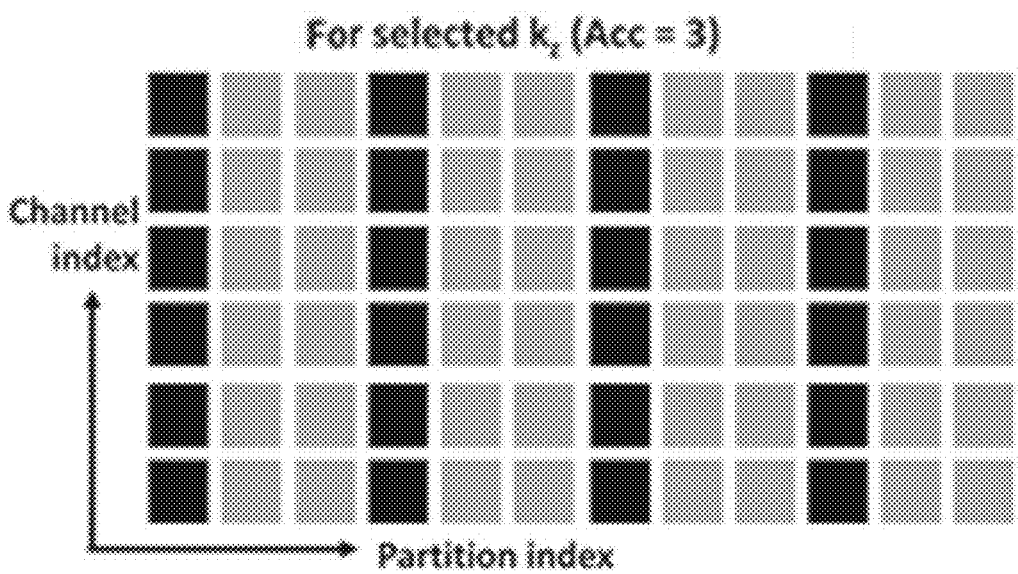
FIG. 1C is a diagram illustrating an accelerated (Acc=3) k-space shift data acquisition with respect to the partition and channel indices, in accordance with at least one aspect of the present disclosure.
Figure 2:
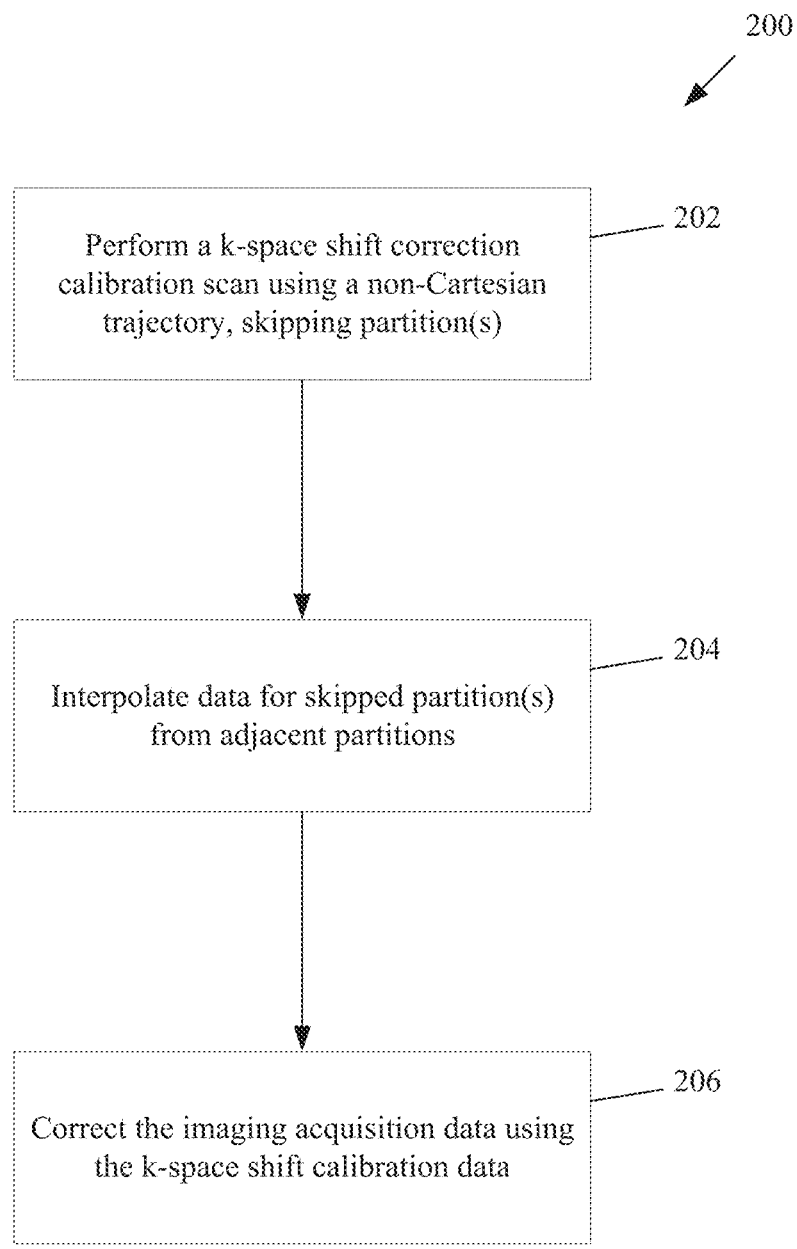
FIG. 2 is a flow diagram of a process for performing an accelerated k-space shift correction calibration scan, in accordance with at least one aspect of the present disclosure.

As shown in FIG. 1A, an MRI scan 100 conventionally includes a calibration scan 102 that is performed prior to the imaging acquisition 104 is performed. The calibration scan 102 can include multiple different calibrations, including a k-space shift calibration (which is sometimes also called a gradient delay calibration acquisition). Conventionally, the calibration scan 102 for k-space shift correction, which is shown in FIG. 1A, acquires the calibration data for all 3D partitions and subsequently calculates k-space shift data as a function of the indices of partition and coil channel, which is shown in FIG. 1B. However, described herein is are embodiments of processes whereby one or more partitions are skipped during the calibrations scan 102 and the data for the skipped or missing partitions is interpolated from adjacent or neighboring partitions for which data was obtained directly during the calibration scan 102, such as is shown in FIG. 1C. In other embodiments, other data dimensions (e.g., the time dimension) could be skipped during the calibrations scan 102 and the data for the skipped or missing data dimensions could be interpolated from adjacent or neighboring data dimensions for which data was obtained directly during the calibration scan 102. As one illustrative example, FIG. 2 shows one such process 200 for performing an accelerated k-space shift correction calibration scan. The process 200 can be implemented by medical imaging systems, such as the medical imaging system 800 illustrated in FIGS. 3A and 3B and described in detail below.

Initially, the medical imaging system 800 implementing the process 200 can apply an MRI sequence. The applied pulse sequence could include a spin-echo sequence (e.g., T1 or T2), a gradient echo (GRE) sequence, and other such pulse sequences applied in the technical field. In the examples described below, the illustrative processes use GRE MRI sequences; however, this is simply for instructive purposes and the process 200 is not limited solely to such MRI sequences.

Accordingly, the medical imaging system 800 performs 202 a k-space shift correction calibration scan using a non-Cartesian trajectory in which one or more partitions are skipped during the calibration scan. In various embodiments, the k-space shift data could be skipped in the partition direction in a periodic manner (i.e., in a pattern) or a non-period manner (i.e., randomly or semi-randomly). In one embodiment, an acceleration factor (Acc) could be defined and the calibration scan could acquire k-space shift correction data for only one partition in every Acc partitions. As one illustrative example, FIG. 1C demonstrates such an accelerated calibration scan for Acc=three (where the dark indices represent where the k-space shift data has been acquired during the calibration scan and the gray indices represent where the k-space shift data has been skipped during acquisition), i.e., the calibration scan only acquires calibration data at one out of every three partitions in a periodic manner. As noted above, although in this embodiment the data dimension that is skipped is the partition dimension, other data dimensions (e.g., the time dimension) could be skipped in other embodiments.

Accordingly, the medical imaging system 800 interpolates 204 the skipped or missing k-space shift data in the partition dimension using the data from adjacent or neighboring partitions that was acquired during the scan. In one embodiment, cubic spline interpolation could be used to interpolate the missing calibration data. In embodiments where other data dimensions (e.g., the time dimension) are skipped, the missing k-space shift data could likewise be interpolate from adjacent or neighboring data for the given data dimension that was acquired during the scan. Accordingly, the medical imaging system 800 corrects 206 the imaging acquisition data obtained by the MRI machine 830 using the k-space shift calibration data, which includes the k-space shift data directly measured by the calibration scan and the interpolated k-space shift data.

This process 200 can be used to calibrate an MRI scan in a much more time-efficient manner than conventional techniques (e.g., using Cartesian trajectories) that require patients to hold their breath for extended periods of time. This process 200 can be used for a variety of different applications and some applications for more efficient free-breathing PDFF/R2* mapping are described in the examples below. The process 200 can be applied to a variety of different free-breathing MRI sequences (e.g., free-breathing T1, T2, and GRE) and any non-Cartesian trajectory (e.g., radial-based or spiral-based acquisition trajectories).

Medical Imaging System Architecture

Figure 3A:
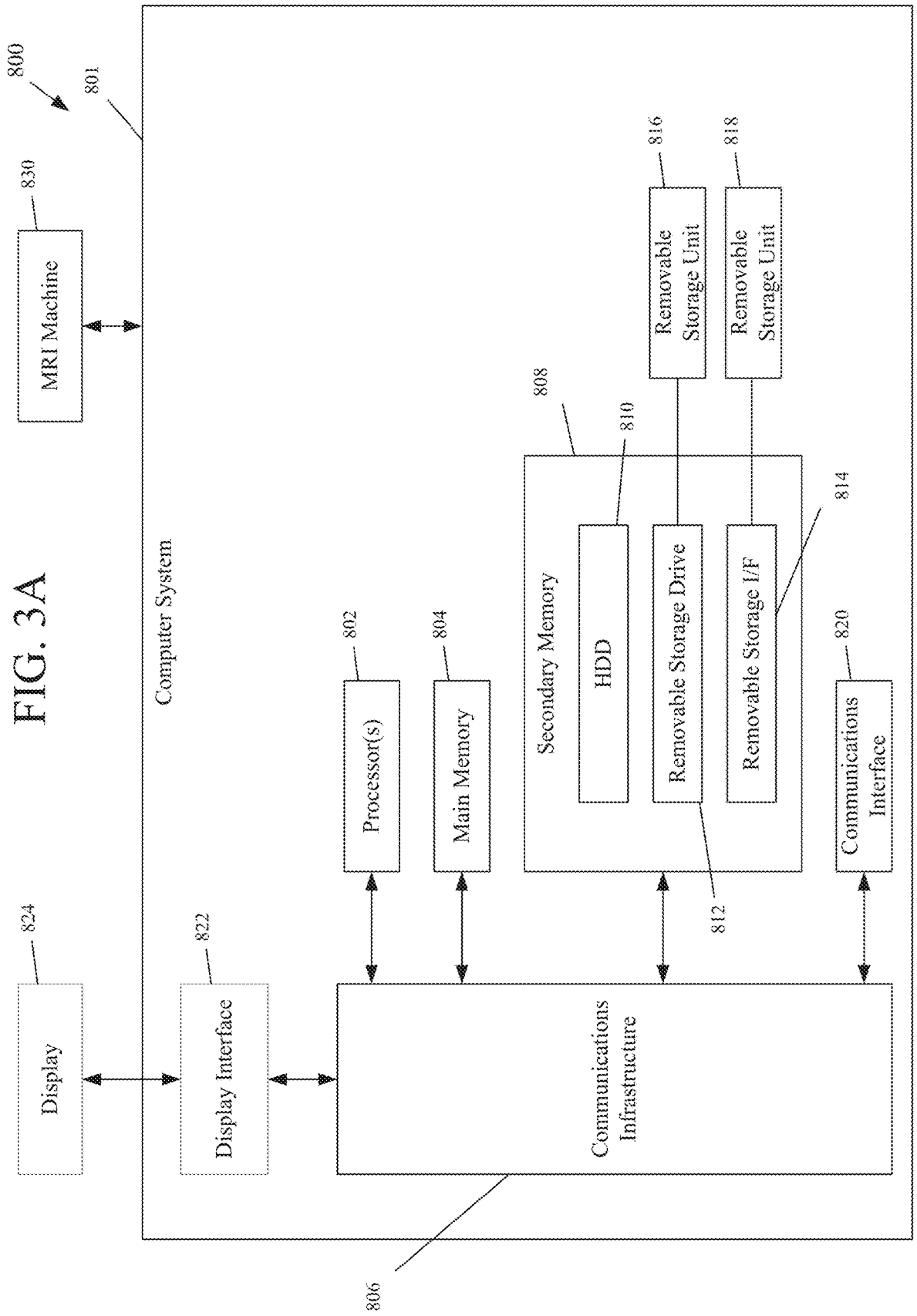
FIG. 3A is a block diagram of a medical imaging system, in accordance with at least one aspect of the present disclosure.
Figure 3B:
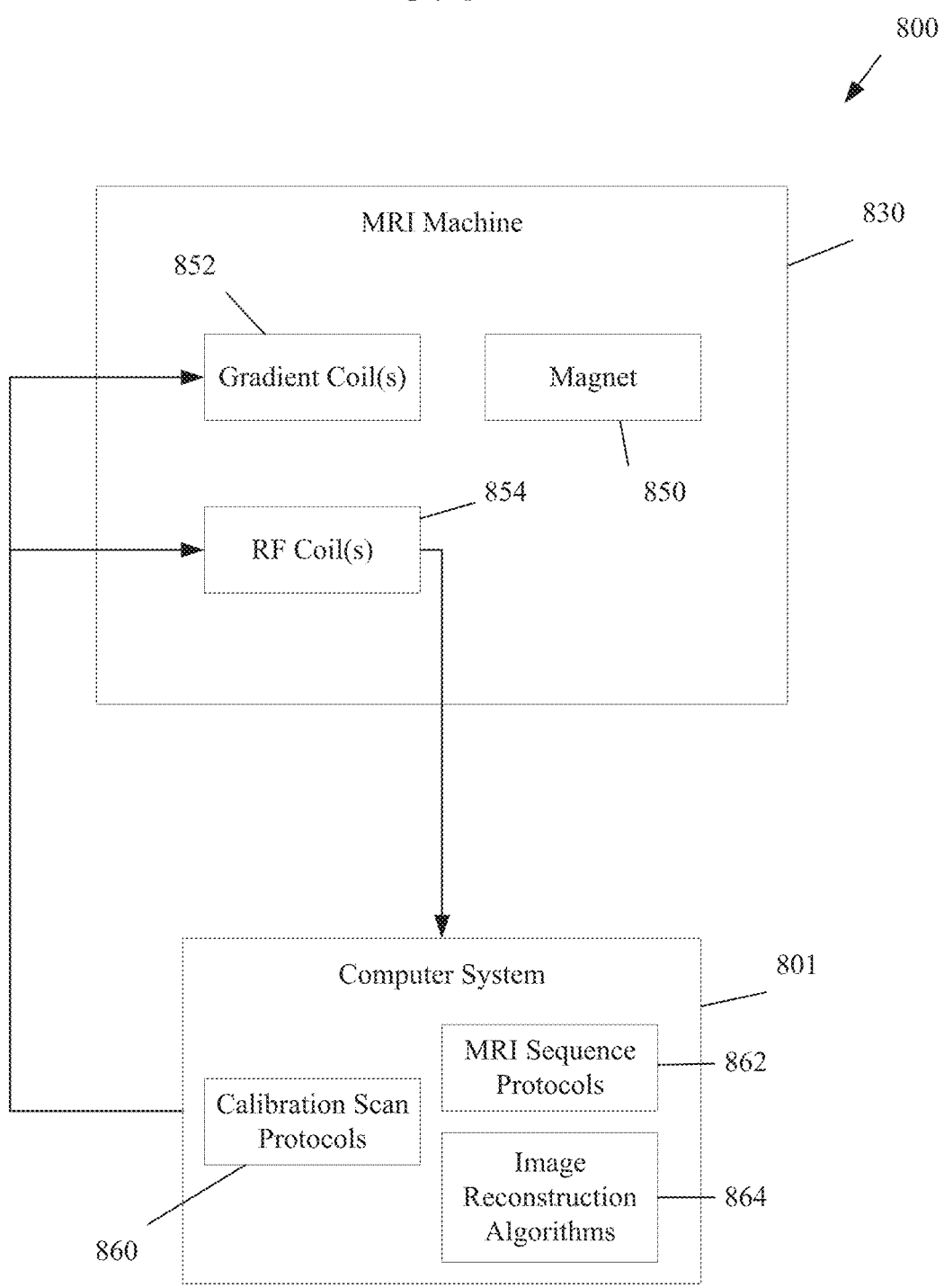
FIG. 3B is a second block diagram of the medical imaging system shown in FIG. 3A, in accordance with at least one aspect of the present disclosure.

In some embodiments, the systems and techniques described above can be implemented in or by a medical imaging system, such as the medical imaging system 800 illustrated in FIGS. 3A and 3B.

FIG. 3A is an architecture diagram of medical imaging system 800 that may be used in some embodiments. As noted above, the medical imaging system 800 can include a computer system 801 and an imaging machine 830 (e.g., an MRI machine). The computer system 801 may include one or more processors 802. Each processor 802 is connected to a communication infrastructure 806 (e.g., a communications bus, cross-over bar, or network). The processor(s) 802 can include a CPU, a GPU, an AI accelerator, and/or a variety of other processor types. Computer system 801 may include a display interface 822 that forwards graphics, text, and other data from the communication infrastructure 806 (or from a frame buffer, not shown) for display on the display unit 824.

Computer system 801 may also include a main memory 804, such as a random access memory (RAM), and a secondary memory 808. The secondary memory 808 may include, for example, a hard disk drive (HDD) 810 and/or removable storage drive 812, which may represent a floppy disk drive, a magnetic tape drive, an optical disk drive, a memory stick, or the like as is known in the art. The removable storage drive 812 reads from and/or writes to a removable storage unit 816. Removable storage unit 816 may be a floppy disk, magnetic tape, optical disk, or the like. As will be understood, the removable storage unit 816 may include a computer readable storage medium having tangibly stored therein (embodied thereon) data and/or computer software instructions, e.g., for causing the processor(s) to perform various operations.

In alternative embodiments, secondary memory 808 may include other similar devices for allowing computer programs or other instructions to be loaded into computer system 801. Secondary memory 808 may include a removable storage unit 818 and a corresponding removable storage interface 814, which may be similar to removable storage drive 812, with its own removable storage unit 816. Examples of such removable storage units include, but are not limited to, USB or flash drives, which allow software and data to be transferred from the removable storage unit 816, 818 to computer system 801.

Computer system 801 may also include a communications interface 820. Communications interface 820 allows software and data to be transferred between computer system 801 and external devices. Examples of communications interface 820 may include a modem, Ethernet card, wireless network card, a Personal Computer Memory Card International Association (PCMCIA) slot and card, or the like. Software and data transferred via communications interface 820 may be in the form of signals, which may be electronic, electromagnetic, optical, or the like that are capable of being received by communications interface 820. These signals may be provided to communications interface 820 via a communications path (e.g., channel), which may be implemented using wire, cable, fiber optics, a telephone line, a cellular link, a radio frequency (RF) link and other communication channels.

In this document, the terms "computer program medium" and "non-transitory computer-readable storage medium" refer to media such as, but not limited to, media at removable storage drive 812, a hard disk installed in hard disk drive 810, or removable storage unit 816. These computer program products provide software to computer system 801. Computer programs (also referred to as computer control logic) may be stored in main memory 804 and/or secondary memory 808. Computer programs may also be received via communications interface 820. Such computer programs, when executed by a processor, enable the computer system 801 to perform the features of the methods discussed herein. For example, main memory 804, secondary memory 808, or removable storage units 816 or 818 may be encoded with computer program code (instructions) for performing operations corresponding to various processes disclosed herein.

Referring now to FIG. 3B, the MRI machine 830 can include a magnet 850 extending along a bore that is configured to receive a patient therein and that is configured to produce a generally uniform magnetic field, one or more gradient coils 852 that are configured to produce magnetic field gradients (e.g., linear gradients), and one or more RF coils 854 that are configured to transmit to RF signals to the patient's body and/or receive RF signals therefrom. The computer system 801 (embodiments of which are described in greater detail above) can store and implement calibration scan protocols 860, MRI sequences protocols 862, and/or image reconstruction algorithms 864, as well as a variety of other software modules known in the technical field. The MRI sequence protocols 862 can be embodied as instructions that, when executed by the computer system 801, cause the computer system 801 to control the gradient coils 852 and/or RF coils 854 to apply a particular sequence of magnetic field gradients and/or RF pulses to the patient. The image reconstruction algorithms 864 can be embodied as instructions that, when executed by the computer system 801, cause the computer system 801 to reconstruct an image of the patient based on the RF signal received from the patient (e.g., by the RF coils 854) as caused by the MRI sequence applied thereto. The calibration scan protocols 860 can likewise be embodied as instructions that, when executed by the computer system 801, cause the computer system 801 to apply particular MRI sequences and/or imaging trajectories (e.g., non-Cartesian trajectories) to calibrate the MRI machine 830 for imaging acquisition and/or parameter mapping applications. The calibration protocols 860 could include the process 200 described above, for example.

It is understood by those familiar with the art that the system described herein may be implemented in hardware, firmware, or software encoded (e.g., as instructions executable by a processor) on a non-transitory computer-readable storage medium.

Examples

To further demonstrate the systems and techniques described herein, an illustrative application of the accelerated calibration scan technique for k-space shift correction in using a multi-echo GRE stack-of-radial prototype pulse sequence will be described. The accelerated calibration scan technique described herein is well-adapted using multi-echo GRE stack-of-radial acquisitions to measure PDFF and R2* because k-space shift calibration is necessary for quantification accuracy. In this example, a multi-echo GRE stack-of-radial prototype pulse sequence was used with golden-angle ordering and k-space shift calibration. Respiratory self-gating signal extracted from the k-space origin was used to accept data acquired near end-expiration for free-breathing in vivo acquisitions with an acceptance rate of 40%. k-space shift calibration was acquired for all partitions and raw data were saved for retrospective reconstruction with different Acc values. For in vivo data, a breath-hold 3D Cartesian GRE prototype pulse sequence provided PDFF and R2* values for reference. Both sequences applied the same multi-step adaptive fitting algorithm for simultaneous PDFF and R2* quantification. A mono-exponential fitting method was used to calculate the R2* map for the phantom.

As a first example, data of a PDFF/R2* phantom (Calimetrix, Madison, Wis., USA) scanned at 1.5T (MAGNETOM AvantoFit, Siemens Healthcare, Erlangen, Germany) at the scanner room temperature with the anterior 18-channel flexible array and the spine array was processed and analyzed using the proposed method. The phantom consists of 7 vials with vendor-provided R2* values of 28.8, 50.3, 92.8, 146.9, 275.8, 573.4, and 946.8 $s^{-1}$ (the last two vials were excluded in the analysis due to very high iron) and 8 vials with vendor-provided PDFF values of 0, 2.7, 4.7, 7.6, 14.4, 30.2, 50.6, and 100%. To better demonstrate the influence of k-space shift for better illustration, synthetic k-space shift values were added to the original k-space data during reconstruction to evaluate the proposed method.

Images were reconstructed with no k-space shift correction, and with correction from data acquired from partitions with acceleration factor Acc=1 (equivalent to each partition), 2, 4, 10, and 64 (equivalent to the center partition only). Subsequent PDFF and R2* values inside vials on 6 neighboring partitions at the k-space original were calculated and compared to vendor provided values using Bland-Altman Analysis.

Figure 4:
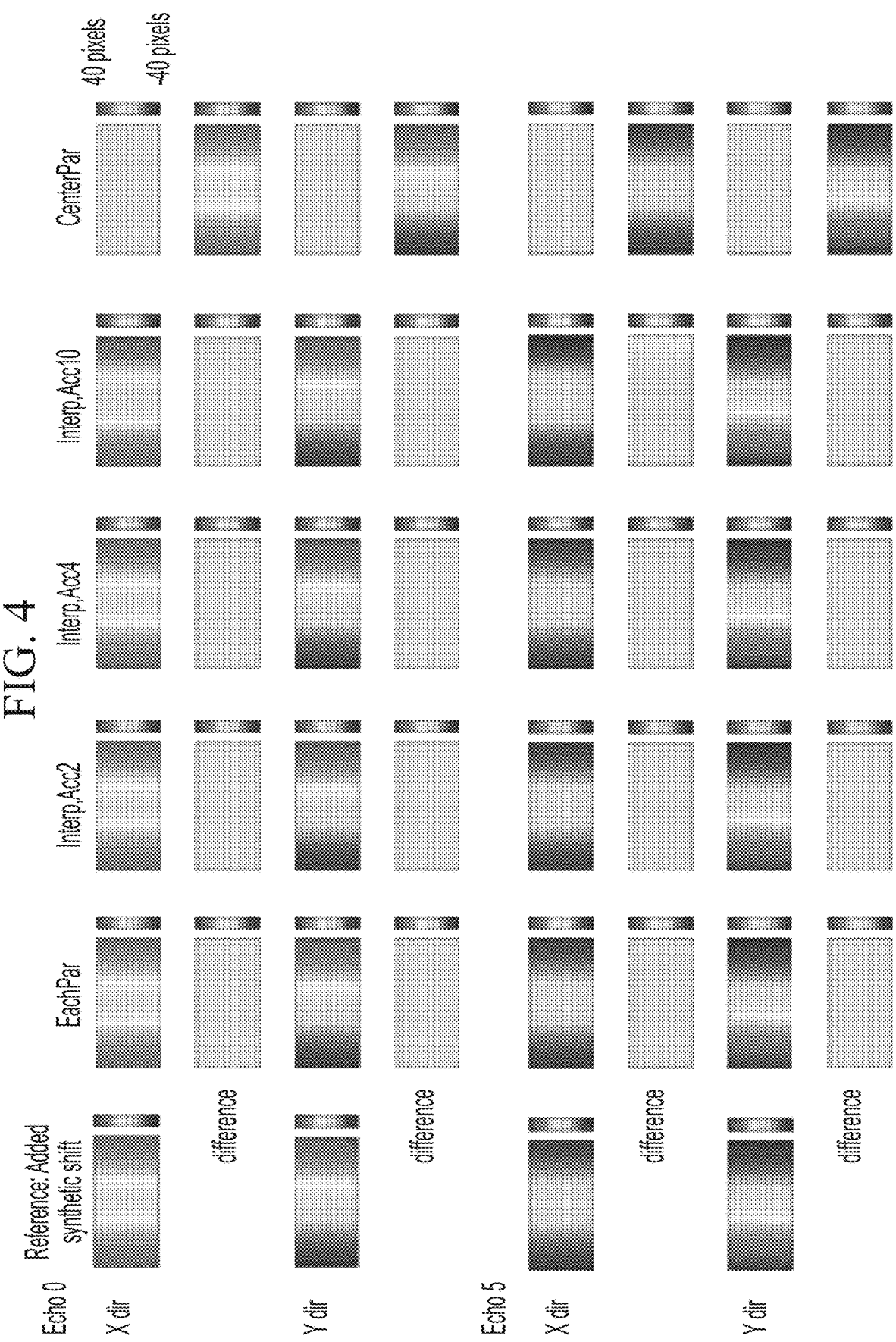
FIG. 4 is a series of k-space shift maps as a function of the indices of partition and coil channel for the phantom, in accordance with at least one aspect of the present disclosure.

The measured k-space shift map as a function of the indices of partition and coil channel for the phantom is shown in FIG. 4. Using the added synthetic k-space shift values in the left column as the reference, the measured k-space shift map using different Acc factors and the difference between them and the reference map of the first and last echoes in both $k_x$ and $k_y$ directions are shown in FIG. 4.

Figure 5:
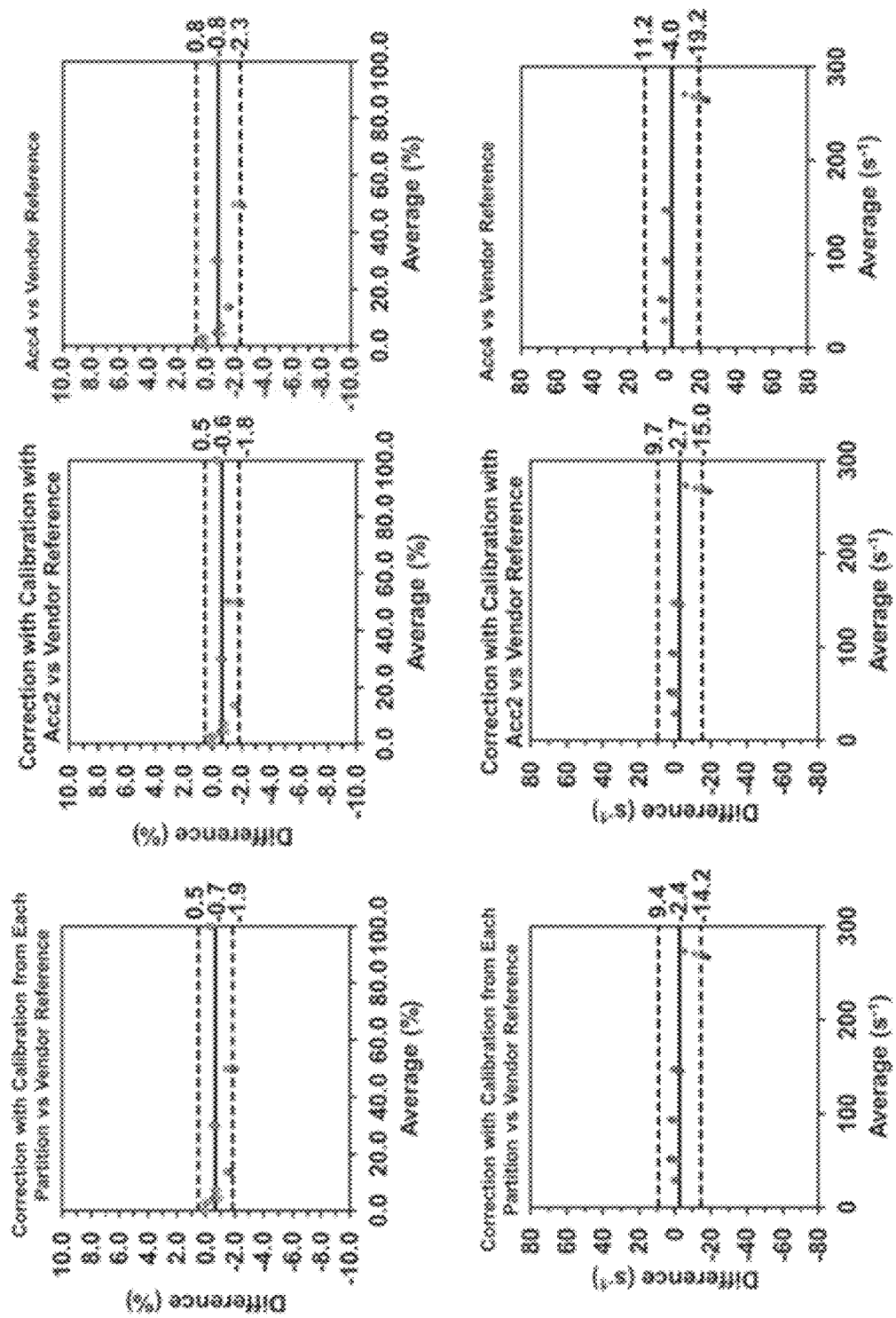
FIG. 5 is a series of Bland-Altman plots of PDFF and R2* values measured from a phantom with different acceleration factors compared to the vendor-provided reference values, in accordance with at least one aspect of the present disclosure.
Figure 5:
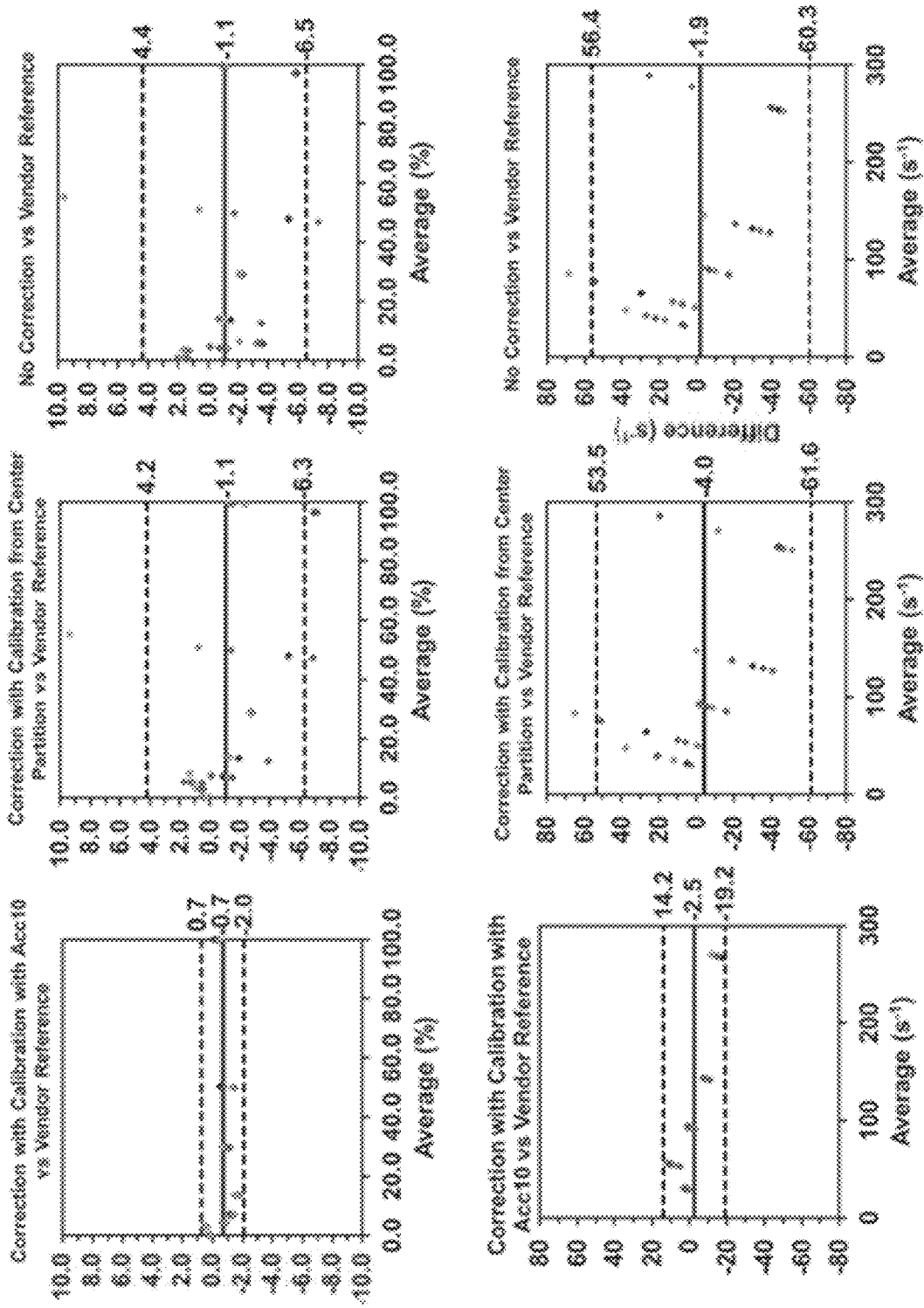

Bland-Altman analysis of the PDFF and R2* values between the proposed method with different Acc factors and the ground-truth is shown in FIG. 5. The mean difference (MD) and level of agreement (LoA) values measured with no correction and calibration from the center partition only were the largest, while those measured with correction from partitions with Acc of 2 and from each partition had the smallest MD values and ranges of LoA. In addition, the larger the Acc was, the larger the MD and the range of the LoA were (i.e., less accurate compared to the vendor-provided ground-truth values).

As another example, a stack-of-radial sequence was performed to a whole liver in a free-breathing acquisition. The multi-echo 3D Cartesian GRE sequence was performed in a single breath-hold as a reference. Data were exported for processing and analysis. Images were reconstructed with no k-space shift correction and with correction from data acquired from partitions with acceleration factor Acc=1 (equivalent to each partition), 3, 4, and the number of partitions (i.e., equivalent to the center partition only). A total of 12 region-of-interests (ROIs) were manually placed by a researcher in the liver segments on four slices. Subsequent PDFF and R2* values inside these ROIs were calculated and compared to reference values of breath-hold Cartesian using Bland-Altman Analysis.

Figure 6:
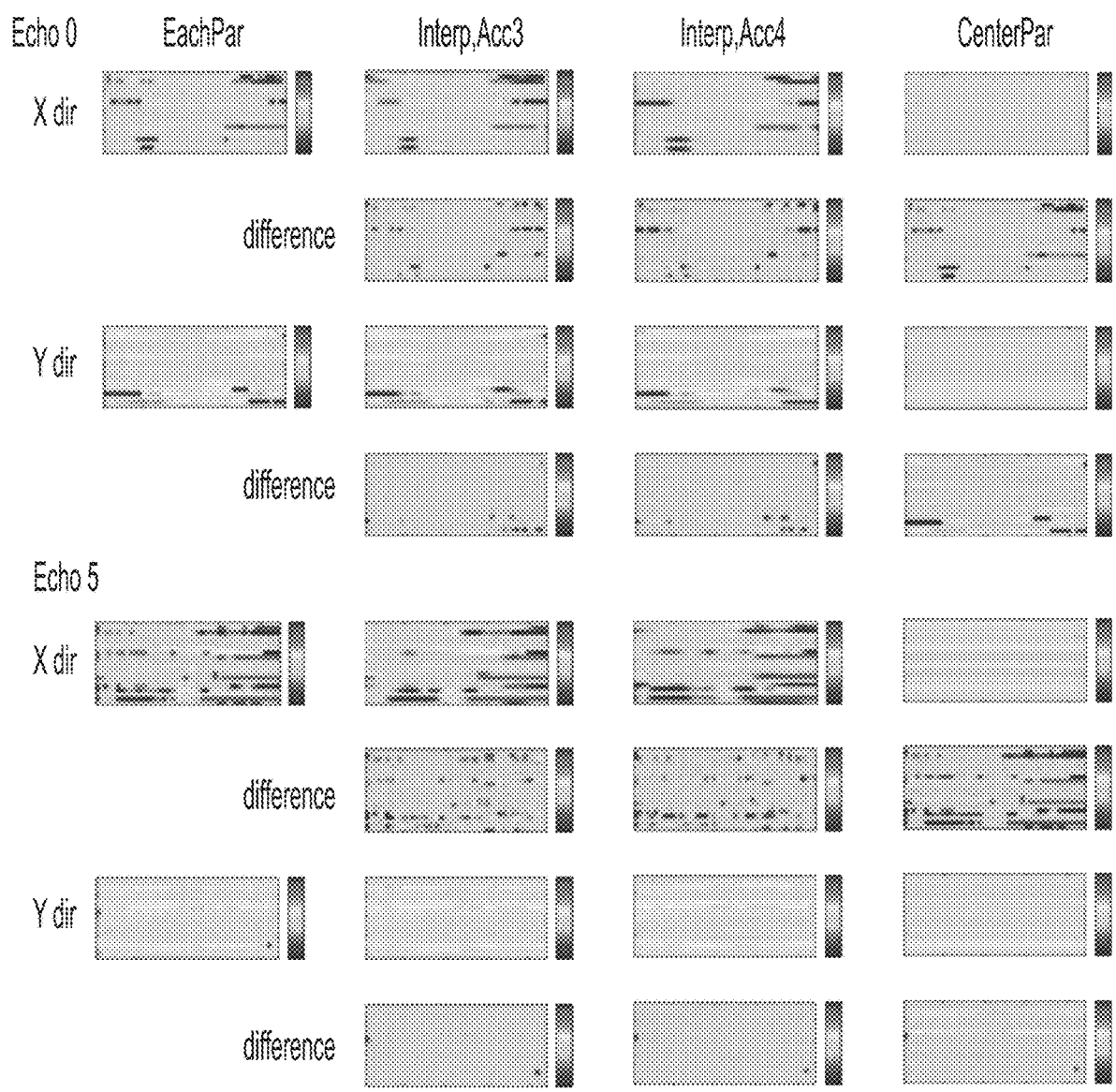
FIG. 6 is a series of k-space shift maps as a function of the indices of partition and coil channel for the representative subject, in accordance with at least one aspect of the present disclosure.

The measured k-space shift map of one representative subject is shown in FIG. 6. As is evident from FIG. 6, the k-space shift map demonstrates a non-uniform distribution as a function of the indices of partition and coil channel. Further, the k-space shift maps were different for $k_x$ and $k_y$ directions, as well as different echoes. k-space shift maps measured with correction from partitions with Acc of 2 and 3 were similar to measurements with correction from each partition, while k-space shift map measured with correction from the center-only partition was different.

Figure 7:
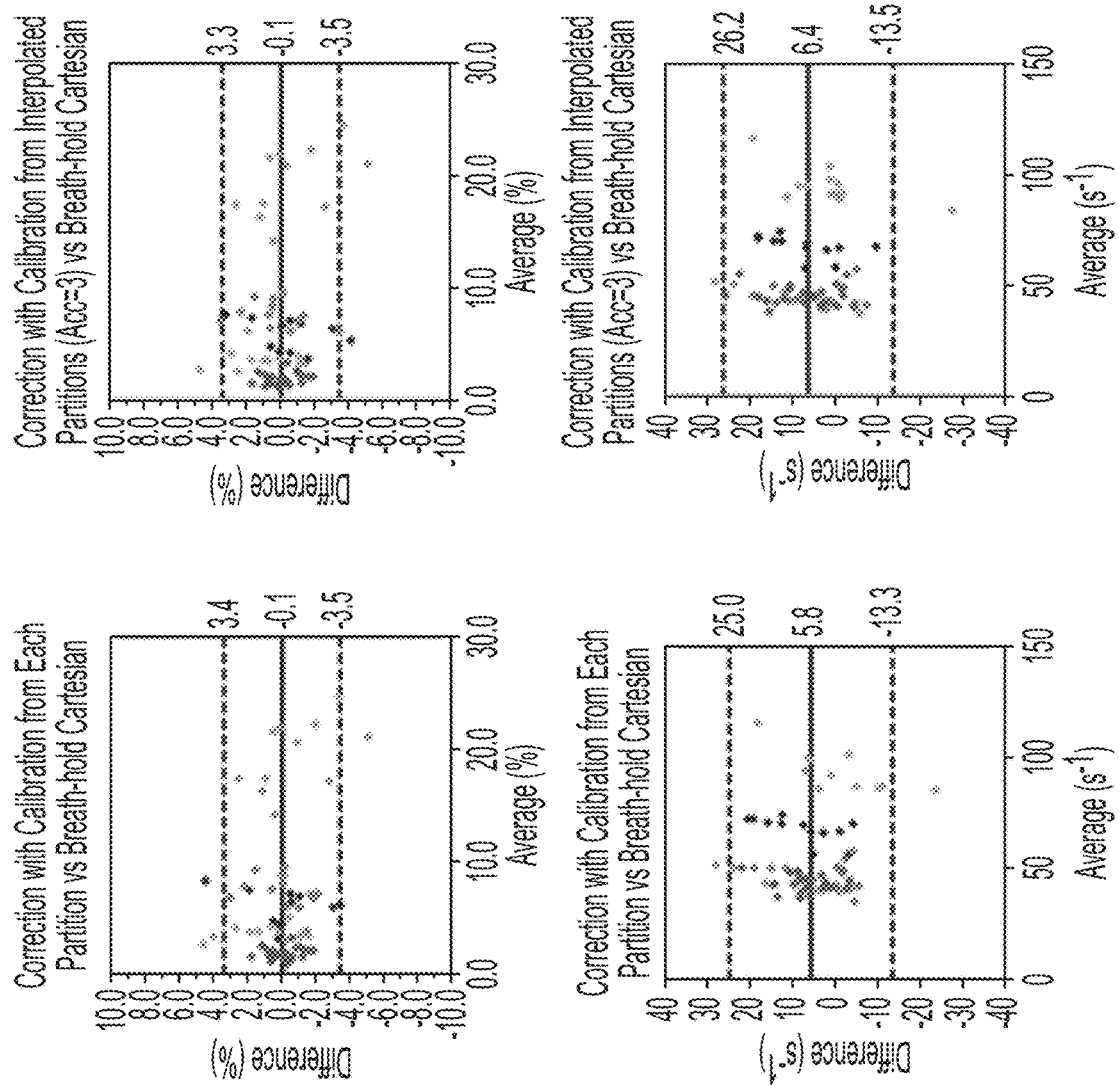
FIG. 7 is a series of Bland-Altman plots of PDFF and R2* values measured by free-breathing stack-of-stars (or equivalently stack-of-radial) acquisitions with different acceleration factors compared to the reference values measured by breath-hold Cartesian acquisitions, in accordance with at least one aspect of the present disclosure.
Figure 7:
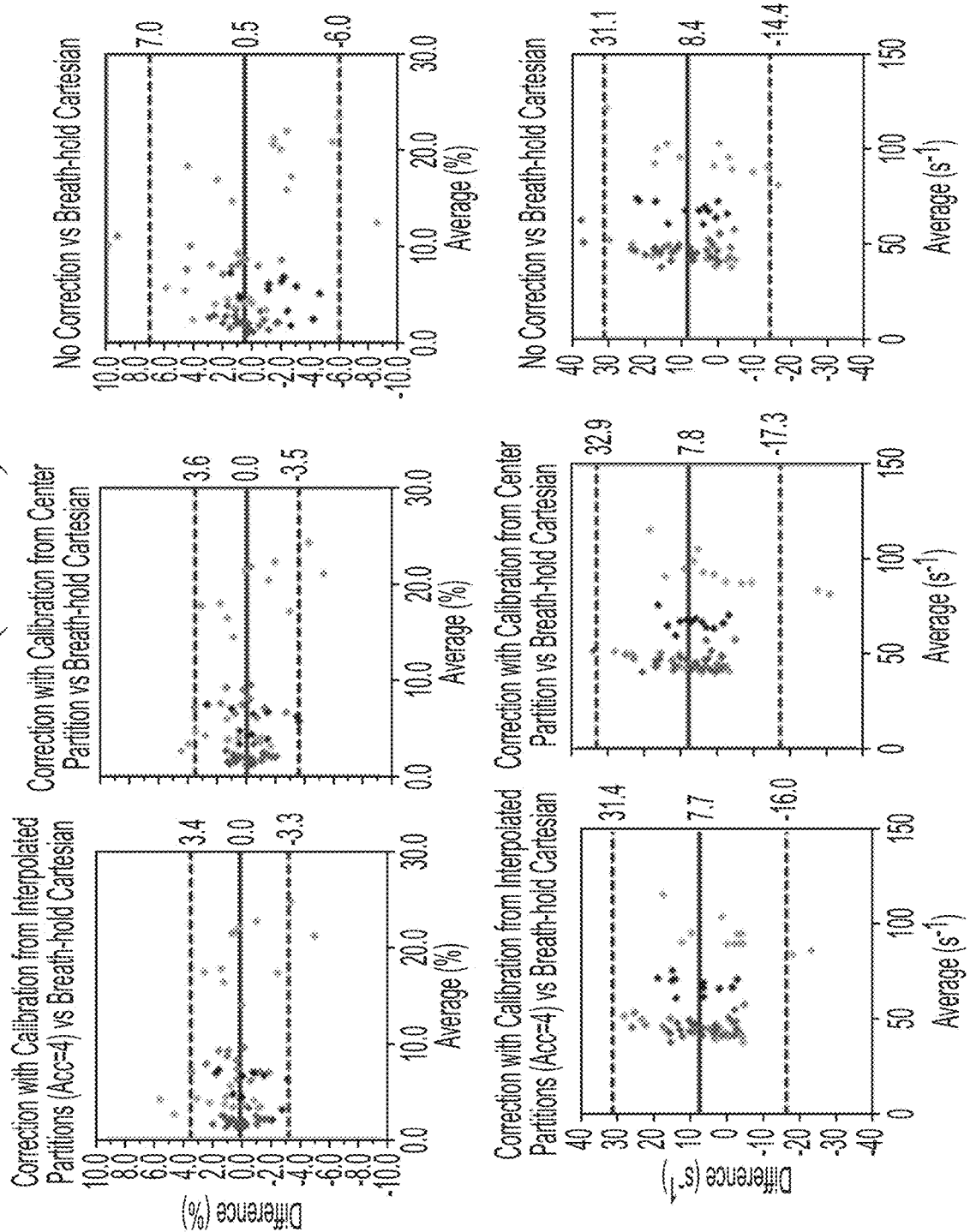

Bland-Altman analysis of the PDFF and R2* values between the proposed method with different Acc factors and the reference values is shown in FIG. 7. It was observed similarly that, compared to the reference values measured by breath-hold Cartesian, PDFF and R2* values measured with no correction exhibited the largest the MD and LoA values. and calibration from the center partition only were the largest, PDFF and R2* values measured with correction from each partition and from partitions with Acc of 3 had the similar and smallest MD values and ranges of LoA. The trend that the larger the Acc was, the larger the MD and the range of the LoA were also was observed.

In sum, the results described above demonstrated agreement in PDFF and R2* results in liver with the proposed acceleration method compared to the reference results of the conventional breath-hold Cartesian technique. Because k-space shift calibration scan for all partitions typically consumes 20 seconds (and could be longer depending on the imaging parameters), accelerating the calibration scan even by a factor of 3 could save 13 seconds or more. This would represent a substantial time saving that could even be sufficient for an additional and separate single breath-hold acquisition. This time saving could be especially beneficial for quantification applications. Accordingly, the systems and methods described herein could allow more efficient free-breathing PDFF/R2* mapping in patient populations with breath-hold difficulties.

Further, although the particular implementations described in these examples used a stack-of-radials trajectory with a GRE pulse sequence for PDFF/R2* mapping and were used for imaging a liver, the techniques described herein are equally applicable to alternative non-Cartesian trajectories, alternative pulse sequences, alternative parameters, imaging alternative organs, and/or different acceleration factors, as described herein.

Further, although the particular implementations described in these examples used partitions as a dimension for acceleration, the concept and techniques described herein are equally applicable to alternative dimensions of the data to be acquired, such as the time dimension if applicable in certain applications.

Further, although the particular implementations described in these examples used free-breathing acquisitions, the concept and techniques described herein are not limited by free-breathing acquisitions. In particular, the concepts and techniques described herein can likewise be applied to breath-hold acquisitions.

Further, although the particular implementations described in these examples used cubic spline as the interpolation method, other interpolation methods can be used.

Further, although the particular implementations described in these examples used interpolation to fill the missing data in the k-space shift calibration, other approaches can be used to fill the missing data, such as deep learning based methods.

Additional information regarding the techniques and results described herein can be found in Zhong, X., 2021. *Accelerated k-Space Shift Calibration for Free-Breathing Stack-of-Radial MRI Quantification of Liver Fat and $R_2$*,* ISMRM (May 15-20, 2021).

While various illustrative embodiments incorporating the principles of the present teachings have been disclosed, the present teachings are not limited to the disclosed embodiments. Instead, this application is intended to cover any variations, uses, or adaptations of the present teachings and use its general principles. Further, this application is intended to cover such departures from the present disclosure that are within known or customary practice in the art to which these teachings pertain.

In the above detailed description, reference is made to the accompanying drawings, which form a part hereof. In the drawings, similar symbols typically identify similar components, unless context dictates otherwise. The illustrative embodiments described in the present disclosure are not meant to be limiting. Other embodiments may be used, and other changes may be made, without departing from the spirit or scope of the subject matter presented herein. It will be readily understood that various features of the present disclosure, as generally described herein, and illustrated in the Figures, can be arranged, substituted, combined, separated, and designed in a wide variety of different configurations, all of which are explicitly contemplated herein.

Aspects of the present technical solutions are described herein with reference to flowchart illustrations and/or block diagrams of methods, apparatuses (systems), and computer program products according to embodiments of the technical solutions. It will be understood that each block of the flowchart illustrations and/or block diagrams, and combinations of blocks in the flowchart illustrations and/or block diagrams, can be implemented by computer readable program instructions.

These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions can also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the figures illustrate the architecture, functionality, and operation of possible implementations of systems, methods, and computer program products according to various embodiments of the present technical solutions. In this regard, each block in the flowchart or block diagrams can represent a module, segment, or portion of instructions, which includes one or more executable instructions for implementing the specified logical function(s). In some alternative implementations, the functions noted in the blocks can occur out of the order noted in the figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

A second action can be said to be "in response to" a first action independent of whether the second action results directly or indirectly from the first action. The second action can occur at a substantially later time than the first action and still be in response to the first action. Similarly, the second action can be said to be in response to the first action even if intervening actions take place between the first action and the second action, and even if one or more of the intervening actions directly cause the second action to be performed. For example, a second action can be in response to a first action if the first action sets a flag and a third action later initiates the second action whenever the flag is set.

The present disclosure is not to be limited in terms of the particular embodiments described in this application, which are intended as illustrations of various features. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. It is to be understood that this disclosure is not limited to particular methods, reagents, compounds, compositions or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein are generally intended as "open" terms (for example, the term "including" should be interpreted as "including but not limited to," the term "having" should be interpreted as "having at least," the term "includes" should be interpreted as "includes but is not limited to," et cetera). While various compositions, methods, and devices are described in terms of "comprising" various components or steps (interpreted as meaning "including, but not limited to"), the compositions, methods, and devices can also "consist essentially of" or "consist of" the various components and steps, and such terminology should be interpreted as defining essentially closed-member groups.

As used in this document, the singular forms "a," "an," and "the" include plural references unless the context clearly dictates otherwise. Unless defined otherwise, all technical and scientific terms used herein have the same meanings as commonly understood by one of ordinary skill in the art. Nothing in this disclosure is to be construed as an admission that the embodiments described in this disclosure are not entitled to antedate such disclosure by virtue of prior invention.

In addition, even if a specific number is explicitly recited, those skilled in the art will recognize that such recitation should be interpreted to mean at least the recited number (for example, the bare recitation of "two recitations," without other modifiers, means at least two recitations, or two or more recitations). Furthermore, in those instances where a convention analogous to "at least one of A, B, and C, et cetera" is used, in general such a construction is intended in the sense one having skill in the art would understand the convention (for example, "a system having at least one of A, B, and C" would include but not be limited to systems that have A alone, B alone, C alone, A and B together, A and C together, B and C together, and/or A, B, and C together, et cetera). In those instances where a convention analogous to "at least one of A, B, or C, et cetera" is used, in general such a construction is intended in the sense one having skill in the art would understand the convention (for example, "a system having at least one of A, B, or C" would include but not be limited to systems that have A alone, B alone, C alone, A and B together, A and C together, B and C together, and/or A, B, and C together, et cetera). It will be further understood by those within the art that virtually any disjunctive word and/or phrase presenting two or more alternative terms, whether in the description, sample embodiments, or drawings, should be understood to contemplate the possibilities of including one of the terms, either of the terms, or both terms. For example, the phrase "A or B" will be understood to include the possibilities of "A" or "B" or "A and B."

In addition, where features of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, et cetera. As a non-limiting example, each range discussed herein can be readily broken down into a lower third, middle third and upper third, et cetera. As will also be understood by one skilled in the art all language such as "up to," "at least," and the like include the number recited and refer to ranges that can be subsequently broken down into subranges as discussed above. Finally, as will be understood by one skilled in the art, a range includes each individual member. Thus, for example, a group having 1-3 components refers to groups having 1, 2, or 3 components. Similarly, a group having 1-5 components refers to groups having 1, 2, 3, 4, or 5 components, and so forth.

Various of the above-disclosed and other features and functions, or alternatives thereof, may be combined into many other different systems or applications. Various presently unforeseen or unanticipated alternatives, modifications, variations or improvements therein may be subsequently made by those skilled in the art, each of which is also intended to be encompassed by the disclosed embodiments.

The invention claimed is:

1. A computer-implemented method for acquiring magnetic resonance imaging (MRI) data using a non-Cartesian trajectory, the method comprising:
    applying, by a MRI system, an MRI sequence;
    performing, by the MRI system, a calibration scan based on the MRI sequence using the non-Cartesian trajectory to acquire k-space shift data, wherein data from a data dimension is skipped during the calibration scan;
    interpolating the skipped data for the data dimension using the k-space shift data from adjacent data for the data dimension; and
    calibrating the MRI data acquired by the MRI system using the k-space shift data and the interpolated k-space shift data.

2. The computer-implemented method of claim 1, further comprising:
    acquiring, by the calibrated MRI system, an image of a patient.

3. The computer-implemented method of claim 1, further comprising:
    generating, by the calibrated MRI system, a parameter map associated with a patient.

4. The computer-implemented method of claim 3, wherein the parameter map comprises liver iron concentration derived from R2* values.

5. The computer-implemented method of claim 1, wherein the non-Cartesian trajectory is selected from the group consisting of a radial trajectory, a spiral trajectory, or a stack-of-stars trajectory.

6. The computer-implemented method of claim 1, wherein interpolating the skipped data for the data dimension comprises applying a cubic spline interpolation.

7. The computer-implemented method of claim 1, wherein the MRI sequence comprising a free-breathing MRI sequence.

8. The computer-implemented method of claim 7, wherein the free-breathing MRI sequence is selected from the group consisting of a free-breathing T1 sequence, a free-breathing T2 sequence, or a free-breathing GRE sequence.

9. The computer-implemented method of claim 1, wherein the data for the data dimension is skipped in a periodic manner.

10. The computer-implemented method of claim 9, wherein:
    an acceleration factor Acc is defined; and
    the calibration scan acquires k-space shift data for only one in every Acc data units in the data dimension.

11. The computer-implemented method of claim 1, wherein the data for the data dimension is skipped in a non-periodic manner.

12. The computer-implemented method of claim 1, wherein the data dimension is selected from a group consisting of a partition dimension and a time dimension.

13. A medical imaging system for acquiring magnetic resonance imaging (MRI) data using a non-Cartesian trajectory, the medical imaging system comprising:
    an MRI machine; and
    a computer system coupled to the MRI machine, the computer system comprising:
        a processor, and
        a memory coupled to the processor, the memory storing instructions that, when executed by the processor, cause the computer system to:
            control the MRI machine to apply an MRI sequence,
            control the MRI machine to perform a calibration scan based on the MRI sequence using the non-Cartesian trajectory to acquire k-space shift data, wherein data from a data dimension is skipped during the calibration scan,
            interpolate the skipped data for the data dimension using the k-space shift data from adjacent data for the data dimension; and
            calibrate the MRI data acquired by the MRI machine using the k-space shift data and the interpolated k-space shift data.

14. The medical imaging system of claim 13, wherein the memory further stores instructions that, when executed by the processor, cause the computer system to:
    control the MRI machine to acquire an image of a patient.

15. The medical imaging system of claim 13, wherein the memory further stores instructions that, when executed by the processor, cause the computer system to:
    control the MRI machine to generate a parameter map associated with a patient.

16. The medical imaging system of claim 15, wherein the parameter map comprises liver iron concentration derived from R2* values.

17. The medical imaging system of claim 13, wherein the non-Cartesian trajectory is selected from the group consisting of a radial trajectory, a spiral trajectory, or a stack-of-stars trajectory.

18. The medical imaging system of claim 13, wherein the skipped data for the data dimension is interpolated by a cubic spline interpolation.

19. The medical imaging system of claim 13, wherein the MRI sequence comprising a free-breathing MRI sequence.

20. The medical imaging system of claim 19, wherein the free-breathing MRI sequence is selected from the group consisting of a free-breathing T1 sequence, a free-breathing T2 sequence, or a free-breathing GRE sequence.

21. The medical imaging system of claim 13, wherein the data for the data dimension is skipped in a periodic manner.

22. The medical imaging system of claim 21, wherein:
   an acceleration factor Acc is defined; and
   the calibration scan acquires k-space shift data for only one in every Acc data units in the data dimension.

23. The medical imaging system of claim 13, wherein the data for the data dimension is skipped in a non-periodic manner.

24. The medical imaging system of claim 13, wherein the data dimension is selected from a group consisting of a partition dimension and a time dimension.

\* \* \* \* \*